United States Patent
Lim

(10) Patent No.: US 8,148,665 B2
(45) Date of Patent: Apr. 3, 2012

(54) APPARATUS AND METHOD FOR SOFT BAKING PHOTORESIST ON SUBSTRATE

(75) Inventor: Chae-Rock Lim, Seoul (KR)

(73) Assignee: LG Display Co., Ltd., Seoul (KR)

(*) Notice: Subject to any disclaimer, the term of this patent is extended or adjusted under 35 U.S.C. 154(b) by 1112 days.

(21) Appl. No.: 11/167,195

(22) Filed: Jun. 28, 2005

(65) Prior Publication Data
US 2006/0054791 A1 Mar. 16, 2006

(30) Foreign Application Priority Data
Aug. 31, 2004 (KR) .................. 10-2004-0069339

(51) Int. Cl.
*F27B 5/06* (2006.01)
*F27D 5/00* (2006.01)
*H01L 21/00* (2006.01)
*H01L 21/683* (2006.01)
*H01L 21/68* (2006.01)

(52) U.S. Cl. ......... 219/390; 219/392; 118/728; 118/729

(58) Field of Classification Search .................. None
See application file for complete search history.

(56) References Cited

U.S. PATENT DOCUMENTS

| | | | | |
|---|---|---|---|---|
| 5,796,066 A | * | 8/1998 | Guyot | 118/728 |
| 5,817,156 A | * | 10/1998 | Tateyama et al. | 118/725 |
| 5,885,423 A | * | 3/1999 | Guyot | 118/728 |
| 6,104,002 A | * | 8/2000 | Hirose et al. | 219/390 |
| 6,231,716 B1 | * | 5/2001 | White et al. | 118/728 |
| 6,829,022 B2 | * | 12/2004 | Kim | 349/58 |
| 6,929,774 B2 | * | 8/2005 | Morad et al. | 266/81 |
| 6,935,466 B2 | * | 8/2005 | Lubomirsky et al. | 118/728 |
| 7,244,311 B2 | * | 7/2007 | Fischer | 118/725 |
| 7,273,403 B2 | * | 9/2007 | Yokota et al. | 445/25 |
| 2005/0022742 A1 | * | 2/2005 | Hong et al. | 118/725 |
| 2005/0028740 A1 | * | 2/2005 | Okuda | 118/728 |
| 2006/0005770 A1 | * | 1/2006 | Tiner et al. | 118/728 |
| 2007/0028842 A1 | * | 2/2007 | Inagawa et al. | 118/728 |

FOREIGN PATENT DOCUMENTS

| | | | |
|---|---|---|---|
| JP | 2000-47398 A | | 2/2000 |
| JP | 2000124127 A | * | 4/2000 |
| JP | 2001311926 A | * | 11/2001 |
| JP | 2002-334828 A | | 11/2002 |
| JP | 2002333515 A | * | 11/2002 |
| JP | 2003-68598 A | | 3/2003 |
| JP | 2003-188068 A | | 7/2003 |
| JP | 2004-87943 A | | 3/2004 |
| JP | 2004-95688 A | | 3/2004 |
| JP | 2004-146446 A | | 5/2004 |
| JP | 2004241702 A | * | 8/2004 |
| KR | 2005067716 A | * | 7/2005 |

OTHER PUBLICATIONS

JP2000-124127A, Partial translation.*
JP2004-241702A, Partial translation.*
JP2002-333515, Nov. 22, 2002, Aoyama, et al, partial translation.*
Partial translation of JP2004-241702 A, Murakami et al, Aug. 26, 2004.*

* cited by examiner

*Primary Examiner* — Joseph M Pelham
(74) *Attorney, Agent, or Firm* — Birch, Stewart, Kolasch & Birch, LLP

(57) ABSTRACT

An apparatus for soft baking a substrate having a dummy region is provided. The apparatus includes a heating plate, a plurality of pins, and a driving unit for individually lifting selective ones of the plurality of pins so as to protrude from an upper surface of the heating plate.

5 Claims, 5 Drawing Sheets

APPARATUS AND METHOD FOR SOFT BAKING PHOTORESIST ON SUBSTRATE

This Nonprovisional application claims priority under 35 U.S.C. §119(a) on Patent Application No. 10-2004-0069339 filed in Korea on Aug. 31, 2004, the entire contents of which are hereby incorporated by reference.

BACKGROUND OF THE INVENTION

1. Field of the Invention

The present invention relates to an apparatus and a method for baking a photoresist, and more particularly, to an apparatus and a method for soft baking a photoresist before performing an exposing process.

2. Description of the Related Art

Recently, portable electronic devices such as a mobile phone, a PDA, and a notebook computer have been widely used. Therefore, there is a strong demand for a flat panel display device with light weight and compact size. The flat panel display device such as a liquid crystal display (LCD), a plasma display panel (PDP), a field emission display (FED), a vacuum fluorescent display (VFD), etc. have been actively researched and developed. Among the above display devices, the LCD device that can be easily driven, massively produced, and realized with high picture quality is in the spotlight.

The LCD device includes an array substrate having pixels, a color filter substrate facing the array substrate for displaying colors, and a liquid crystal layer formed between the array substrate and the color filter substrate. An electric field applied on the liquid crystal layer controls an alignment direction of the liquid crystal layer.

A switching device such as a thin film transistor for driving the pixel is arranged adjacent to the pixel on the array substrate. The thin film transistor is fabricated by using a semiconductor fabricating process, including a photolithography process using a photoresist pattern.

The photolithography process includes a process for depositing a thin film on a substrate, a process for applying a photoresist on the thin film, a process for exposing the photoresist, a process for developing the photoresist, a process for etching the thin film by using the developed photoresist pattern, a process for stripping the photoresist pattern, and a process for washing the substrate.

The process for patterning a photoresist is referred to as a photo process. The photo process includes a process for surface-processing a substrate so that a photoresist can be smoothly deposited on the substrate, a process for depositing a photoresist on the substrate, a soft baking process for removing a solvent in the deposited photoresist, a process for applying a mask to the soft baked photoresist and exposing the soft baked photoresist, a process for developing the exposed photoresist, and a hard baking process for hardening the photoresist developed so that the photoresist is formed as a certain pattern. The photoresist can be uniformly deposited on the substrate by a spin coating method.

Referring to FIGS. 1A and 1B, a soft baking apparatus is inside a chamber in which the soft baking process and the hard baking process are mainly performed. The soft baking apparatus will be explained in more detail hereinbelow.

The soft baking process is performed in order to remove a part of a solvent in the deposited photoresist. Therefore, the soft baking apparatus is provided with a heating plate for heating the substrate on which a photoresist is deposited and for evaporating the solvent in the photoresist.

The soft baking apparatus is divided into a contact type soft baking apparatus and a non-contact type soft baking apparatus. For the contact type soft baking apparatus, the substrate 102 is in direct contact with a heating plate 101 as shown in FIG. 1A. For the non-contact type soft baking apparatus, the substrate 102 is spaced apart from the heating plate 101 by a certain distance as shown in FIG. 1B. A heating wire 103 for supplying heat to the heating plate 101 is installed in the heating plate 101.

For the contact type soft baking apparatus, since the substrate is in direct contact with the heating plate 101 in which a heating wire is installed, the heat distribution may be non-uniform on the substrate. Therefore, as shown in FIG. B, the non-contact soft baking apparatus is developed. As shown in FIG. 1B, the substrate 102 is spaced apart from the heating plate 101 by a certain distance by a plurality of lift pins 104.

FIGS. 2A and 2B are top views showing a substrate 200 spaced apart from the heating plate 101 by a plurality of lift pins 202 formed on the heating plate 101. As shown in FIGS. 2A and 2B, the substrate 200 is divided into an LCD panel region 201 and a non-LCD panel region 204, i.e., the dummy region.

The lift pins 202 formed on the heating plate are constructed to be simultaneously lifted or lowered. Before the substrate is introduced into the soft baking apparatus, the lift pins 202 are lifted and wait for the substrate to be loaded. All the lift pins 202 are simultaneously lifted by a certain height from the upper surface of the heating plate. Then, the substrate 200 is loaded on the lift pins 202 for a soft baking process.

However, a contact region of the substrate contacted by the lift pins 202 and a non-contact region of the substrate are heated at different temperatures during the soft baking process. Therefore, the photoresist on the contact region and the non-contact region has different drying speeds and contraction degrees, which cause an inferior baked photoresist pattern in the exposing process.

That is, since the contact region and the non-contact region have different heating speeds and cooling speeds, spots are generated on the substrate in the exposing process. Therefore, it is important to make sure that the lift pins do not contact the LCD panel region in order to have a uniform baked photoresist in the LCD panel region before performing the exposing process.

However, since the LCD panel region may be arranged on different substrates in different ways, the LCD panel region of a certain substrate may not be in contact with the lift pins, but the LCD panel region of another substrate may be in contact with the lift pins, thereby causing spots on the substrate in the exposing process.

FIGS. 2A and 2B show two different arrangements of the LCD panel region on two different substrates that are loaded into a soft baking apparatus with all-lifted lift pins. FIG. 2A shows that the lift pins 202 are not in contact with the smaller-size LCD panel region 201. FIG. 2B shows that the lift pins 202 are in contact with the larger-size LCD panel region. In the case of FIG. 2B, spots may be generated on the LCD panel region when the soft baked photoresist is exposed to light.

SUMMARY OF THE INVENTION

Therefore, an object of the present invention is to provide a soft baking apparatus having a plurality of lift pins capable of preventing the generation of spots on the LCD panel region in an exposing process.

Another object of the present invention is to provide a soft baking apparatus capable of soft baking substrates with different arrangements of LCD panel regions without causing inferior baked photoresist patterns.

Still another object of the present invention is to provide a method for soft baking substrates with different arrangements of LCD panel regions by using the soft baking apparatus.

The soft baking apparatus in one aspect comprises a plurality of individually-driven lift pins, a driving unit for respectively driving the plurality of lift pins, and a controller for controlling the driving unit according to an arrangement of the LCD panel region on a substrate.

To achieve these and other advantages and in accordance with the purpose of the present invention, as embodied and broadly described herein, there is provided a soft baking apparatus comprising: a heating plate; a plurality of pins; and a driving unit for individually lifting selective ones of the plurality of pins so as to protrude from an upper surface of the heating plate.

To achieve these and other advantages and in accordance with the purpose of the present invention, as embodied and broadly described herein, there is also provided a method for soft baking a photoresist comprising: selecting lift pins among a plurality of lift pins; individually lifting the selected lift pins; loading the substrate on the selected lift pins; and soft baking the substrate.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

A process for fabricating a thin film transistor includes several processes for forming a thin film pattern. The thin film is formed by a photolithography process. The photolithography process includes a photo process for patterning a photoresist, and the photo process includes a soft baking process, an exposing process, and a hard baking process.

In the soft baking process, when a substrate on which a photoresist is deposited is in contact with lift pins, a temperature difference is generated between a contact region and a non-contact region of the substrate. Therefore, this temperature difference causes spots on the substrate in the exposing process.

Figure 1A:
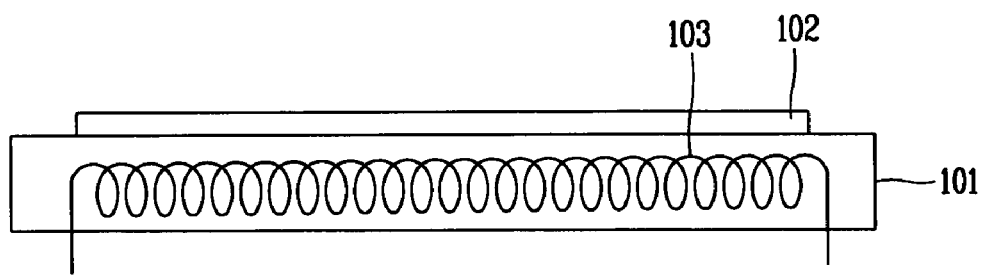
FIGS. 1A and 1B are sectional views showing a structure of a heating plate in accordance with the related art.
Figure 1B:
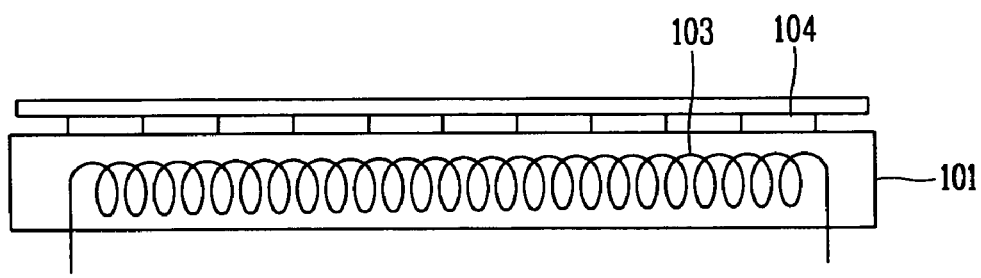
Figure 2A:
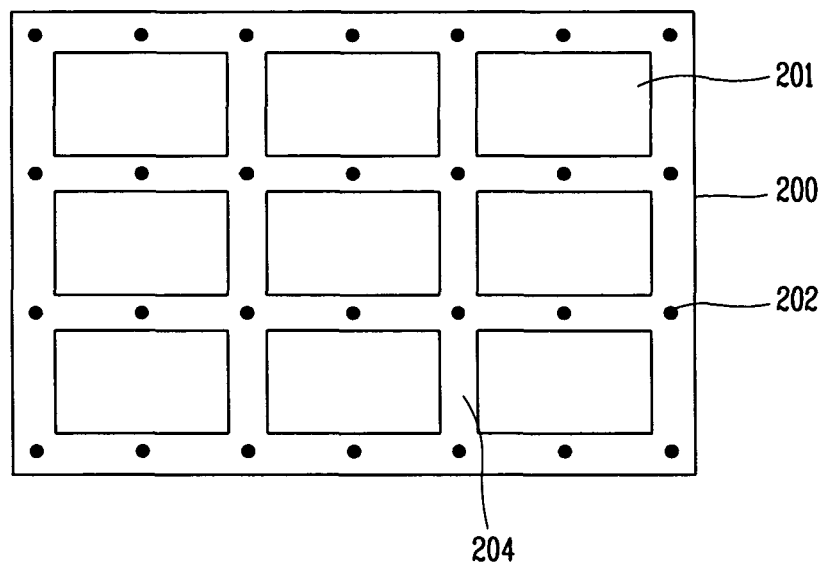
FIGS. 2A and 2B are top views showing a substrate that has been loaded onto the heating plate in accordance with the related art.
Figure 2B:
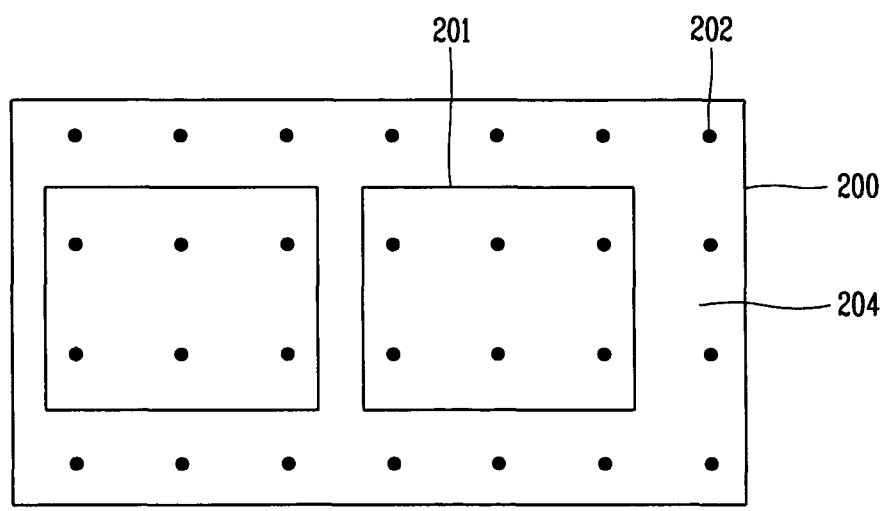
Figure 3:
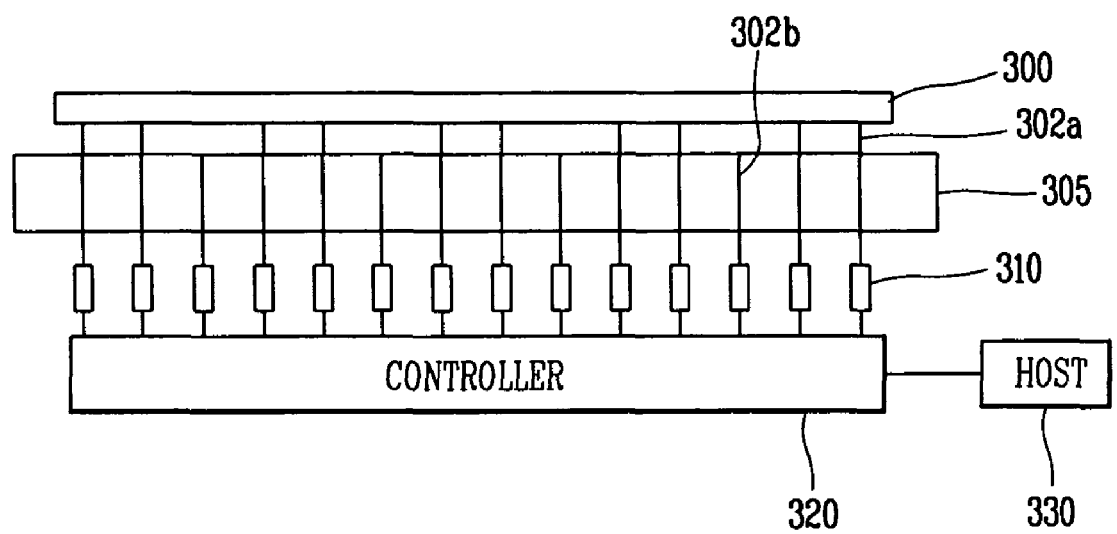
FIG. 3 is a cross-sectional view showing a structure of a soft baking apparatus according to an embodiment of the present invention.

In order to solve this problem, during a soft baking process according to an embodiment of the present invention, lift pins for supporting a substrate are selectively in contact with a peripheral region or so-called dummy region or non-LCD region of the substrate where an LCD panel is not formed. A soft baking apparatus according to an embodiment of the present invention will be explained in more detail with reference to FIG. 3.

In this embodiment, the soft baking apparatus includes a chamber (not shown). A heating plate 305 for heating a substrate 300 is installed in the chamber. A heating wire (not shown) for heating the introduced substrate 300 is installed in the heating plate 305. A plurality of lift pins 302a and 302b are installed on a surface of the heating plate 305 to be lifted or lowered. That is, when the lift pins 302a and 302b are lowered, the lift pins 302a and 302b will not protrude from the upper surface of the heating plate 305. However, when the lift pins 302a and 302b are lifted, the lift pins 302a and 302b protrude from the upper surface of the heating plate 305 by a certain height. A driving unit 310 for lifting or lowering the lift pins is installed below each of the lift pins 302a and 302b. However, it should be noted that it can be a single driving unit 310 for individually driving the lift pins. The driving unit 310 may include a step motor and an arbitrary unit for individually lifting or lowering the lift pins.

The lift pins 302a and 302b according to an embodiment of the present invention can be individually up-down controlled, and can be selectively up-down controlled according to an arrangement of an LCD panel region on the substrate. In this embodiment, the lift pins 302a and 302b are controlled by a controller 320. The controller 320 receives arrangement information of the LCD panel region on the substrate 300 from a host 330 and selects lift pins corresponding to a dummy region so that the lift pins are lifted by the driving units 310 to contact the dummy region and will not contact the LCD panel region.

In this embodiment, the arrangement information of the LCD panel region on the substrate is determined before fabricating the substrate. The controller 320 receives the arrangement information of the LCD panel region and analyzes the information. After receiving the arrangement information, the controller 320 selects lift pins that can only be in contact with a non-LCD panel region (i.e., the dummy region) and controls the driving units 310 to lift the selected lift pins.

In this embodiment, a plurality of lift pins are provided so that lift pins to be lifted can be selected based on different arrangements of the LCD panel region when soft baking the substrate. Accordingly, even if various LCD panels are arranged on different substrates, the lift pins can be selectively in contact with a dummy region only.

Figure 4A:
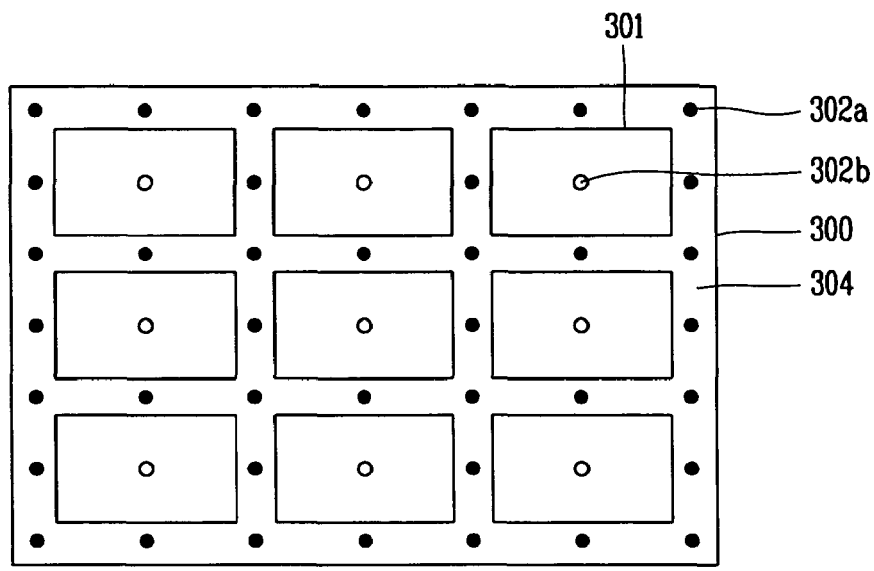
FIGS. 4A to 4C are top views showing a substrate loaded onto a heating plate according to an embodiment of the present invention.
Figure 4B:
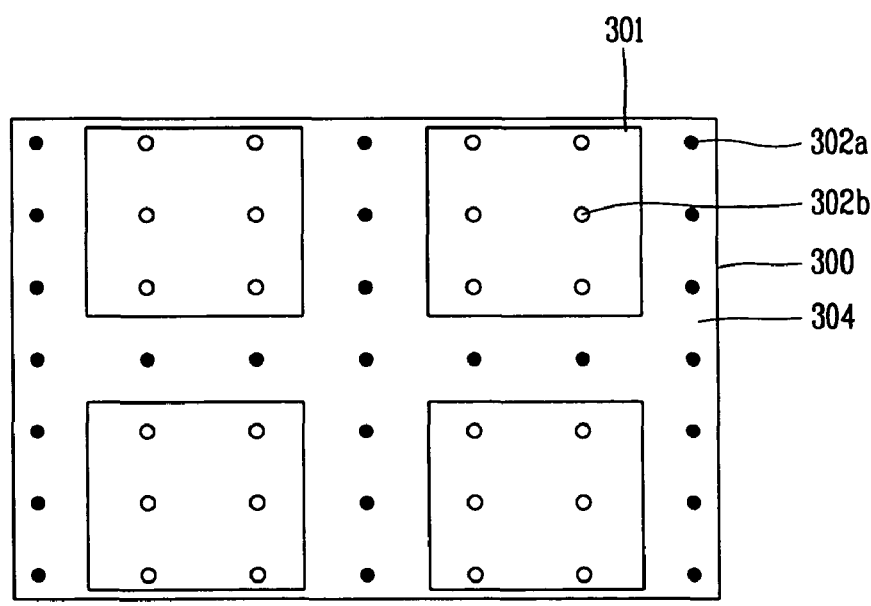
Figure 4C:
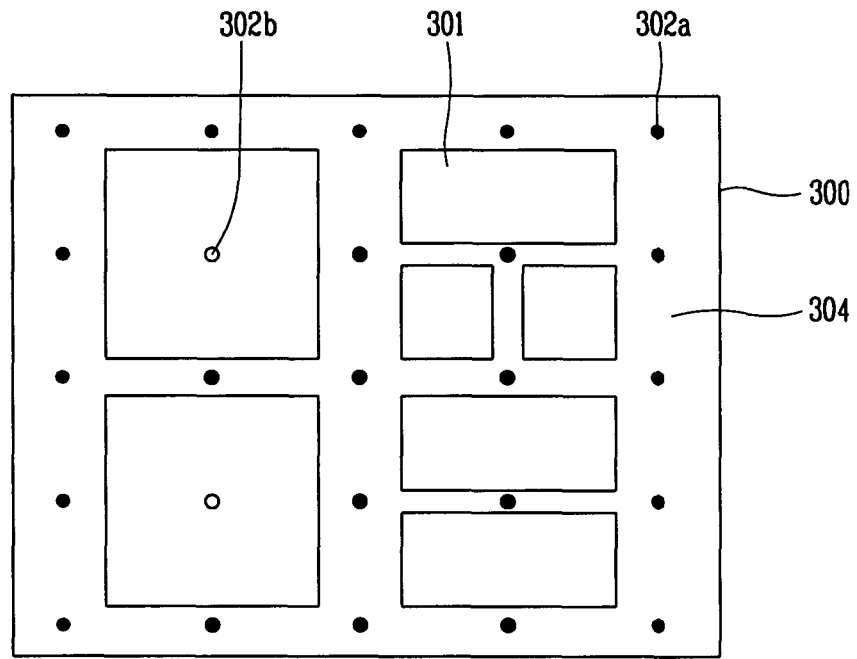

FIGS. 4A to 4C are top views showing that the substrate 300 on which the LCD panel region is variously arranged is supported by the lift pins 302a and 302b. As shown in FIGS. 4A to 4C, the lift pins 302b corresponding to the LCD panel region 301 are not lifted. Only the lift pins 302a corresponding to the dummy region 304 are lifted to support the substrate 300. Accordingly, the entire LCD panel region would be heated in the same condition when soft baking the substrate, thereby preventing the generation of spots in the LCD panel region in an exposing process.

Figure 5:
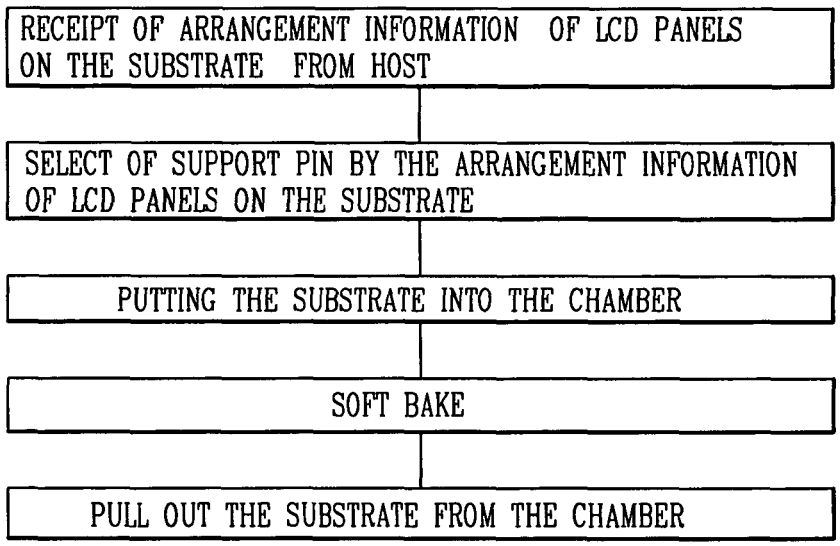
FIG. 5 is a flowchart illustrating a soft baking process by the soft baking apparatus according to an embodiment of the present invention.

A method for driving the soft baking apparatus according to an embodiment of the present invention will be explained with reference to FIG. 5. Generally, a substrate has a larger size than an LCD panel. Accordingly, a plurality of LCD panels can be formed on one substrate to reduce the costs. It is possible to form a plurality of LCD panels having a single size on one substrate. It is also possible to form a plurality of LCD panels having different sizes on one substrate.

In this embodiment, at the time of fabricating the substrate, an LCD panel region is pre-defined before subsequent processes are performed. Arrangement information of the LCD panel region on the substrate is pre-stored in a host. During a soft baking process, the controller for controlling the lift pins of the soft baking apparatus receives the arrangement information of the LCD panel region of the substrate from the host. Then, the controller analyzes the arrangement information of the LCD panel region and the dummy region of the substrate.

When the substrate is loaded onto the heating plate, the controller selects lift pins corresponding to the dummy or non-LCD panel region of the substrate. Since the arrangement information of the lift pins are analyzed by the controller, the controller only selects the lift pins corresponding to the non-LCD panel region to be lifted in contact with the non-LCD panel region. In this embodiment, each step motor installed below the selected lift pins is driven by the controller to lift the selected lift pins. After the selected lift pins are lifted, the substrate is introduced into the soft baking apparatus by a robot arm through the entrance. The introduced substrate is loaded on a set position of the heating plate by the robot arm controlled by the host. As a result, the selected lift pins are in contact with the dummy region of the substrate to thereby support the substrate.

Then, the soft baking apparatus performs a process for soft baking a photoresist deposited on the substrate. Generally, the photoresist includes a solvent of 80~90% and a solid materials of 10~20%. After depositing the photoresist on the substrate by a spin coating method, etc., a soft baking process is performed in order to remove the solvent by evaporation. After the soft baking process, the solvent of the photoresist deposited on the substrate is evaporated and the volume of the photoresist is decreased.

Since a temperature difference is caused by the contact between the lift pins and the substrate, if the lift pins are in contact with the LCD panel region, the spots may be generated in the LCD panel region during the exposing process. However, in this embodiment, the lift pins are only in contact with the dummy region. In other words, the temperature difference in the LCD panel region will be eliminated in the soft baking process. Therefore, no spots will be generated on the LCD panel region due to the temperature difference, and precise and uniform patterns will be formed on the entire LCD region.

After the soft baking process is completed, the robot arm picks up the substrate and subsequent photo processes are performed. The substrate is exposed to light by an exposing apparatus using a mask. Then, the exposed photoresist sequentially undergoes a developing process, a hard baking process, an etching process, and a strip process.

In this embodiment, the selected lift pins and the dummy region of the substrate are in contact with each other during the soft baking process. Although the spots will be generated on the dummy region in the exposing process, those spots will be removed. In case the spots are generated on the LCD panel region of the substrate, it would cause defects and deteriorate the picture quality of the LCD panel. Accordingly, by selectively lifting the lift pins corresponding to the dummy region according to this embodiment, it effectively prevents generating spots on the LCD panel region in a photo process. Therefore, the picture quality of the LCD panel region can be significantly improved. Also, even if the LCD panel region is variously arranged on the substrate, a desirable soft baking process without causing an inferior photoresist pattern can be performed by using the soft baking apparatus in this embodiment.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. An apparatus for soft baking a substrate, the substrate having a plurality of separate LCD panel regions and dummy regions, the apparatus comprising:
    a heating plate;
    a heating unit configured to heat the heating plate, wherein the heating unit is a heating wire installed in the heating plate;
    wherein the plurality of LCD panel regions includes LCD panel regions having different sizes;
    a plurality of lift pins to support the dummy regions of the substrate form soft baking of the substrate, the lift pins being located underneath interior and peripheral portions of the substrate;
    a corresponding number of driving units to activate the plurality of the lift pins beneath the interior and peripheral portions of the substrate, wherein the driving units are configured to individually actuate selective ones of the plurality of lift pins so as to protrude from an upper surface of the heating plate by an arrangement information of LCD panels, wherein the selective ones of the lift pins are adapted to have the substrate placed in contact with only the dummy region of the substrate to support the substrate, and each lift pin is adapted to be individually raised or lowered by a corresponding driving unit, and wherein each driving unit is installed below each lift pin; and
    a controller controlling the lift pins, wherein the controller receives arrangement information of the LCD panel regions determined before fabricating the substrate from a host and selects lift pins corresponding to a dummy region so that the lift pins beneath the interior and peripheral portions of the substrate are lifted by the driving units to contact the dummy regions and will not contact the LCD panel region, and the controller selects lift pins that can only be in contact with non-LCD panel regions and controls the driving units to lift all lift pins beneath the dummy regions after receiving the arrangement information.

2. The apparatus of claim 1, wherein at least one LCD panel is located in the display region and no LCD panel is located in the dummy region.

3. An apparatus for soft baking a substrate having a plurality of separate LCD panel regions and dummy regions, the apparatus comprising:
    a heating plate;
    a plurality of lift pins located beneath interior and peripheral portions of the substrate;
    wherein the plurality of LCD panel regions includes LCD panel regions having different sizes;
    a corresponding plurality of driving units, each driving unit being installed below each lift pin, wherein each driving unit includes a motor, the each one of the plurality of lift pins being individually liftable by a respective motor and a controller configured to individually control the plurality of driving units and which is adapted to lift selective ones of the plurality of pins located beneath the interior and peripheral portions of the substrate so as to protrude from an upper surface of the heating plate to receive and support the substrate, wherein the controller is adapted to receive a layout information of the dummy regions and to control the respective motor to lift the respective one of the plurality of pins corresponding to the dummy regions on the substrate, and each one of the plurality of pins are individually movable by the respective one of the plurality of driving units, and the controller receives arrangement information of the LCD panel regions and dummy regions determined before fabricating the substrate from a host and selects lift pins corresponding to dummy regions so that the lift pins are lifted by the driving units to contact the dummy region and will not contact the LCD panel regions, and the controller selects lift pins that can only be in contact with a non-LCD panel region and controls the driving units to lift all lift pins beneath the dummy regions after receiving the arrangement information.

4. The apparatus of claim 3, wherein the lifted selective ones of the plurality of pins are located to come in contact with only the dummy region to support the substrate.

5. A method for soft baking a substrate having a plurality of display panels and a plurality of dummy regions, the method comprising:

providing the substrate to a soft baking apparatus provided with a plurality of motor controlled lift pins adapted to support interior and peripheral portions of the substrate in the soft baking apparatus, wherein the plurality of display panels have different sizes, wherein each motor is installed below each lift pin;

receiving a layout information of the dummy region from a host to identify those motor controlled lift pins located beneath only the dummy regions of the substrate through a controller, wherein the controller receives arrangement information of the LCD panel regions determined before fabricating the substrate from the host and selects lift pins corresponding to the dummy regions so that the lift pins are lifted by the driving units to contact the dummy regions and will not contact an LCD panel region, and the controller selects lift pins that can only be in contact with a non-LCD panel region and controls the driving units to lift the selected lift pins after receiving the arrangement information;

selecting and actuating just those, and all of those, motor controlled lift pins located beneath interior and peripheral portions of the substrate that are also located beneath only the dummy region of the substrate through the controller to support the substrate in the soft baking apparatus; and soft baking the substrate, wherein each one of the plurality of lift pins that are actuated to support the substrate are individually lifted.

* * * * *